United States Patent [19]

Noshiro et al.

[11] 4,019,904

[45] Apr. 26, 1977

[54] PLANOGRAPHIC PRINTING PLATES AND A METHOD OF PREPARING THEM USING PHOTOPOLYMERIZABLE ORGANOPOLYSILOXANES WITH MALEIMIDO GROUPS

[75] Inventors: Atsumi Noshiro, Chiba; Minoru Takamizawa, Annaka; Yasushi Yamamoto, Annaka; Yoshio Inoue, Annaka; Hitoshi Fujii, Tokyo, all of Japan

[73] Assignees: Dai Nippon Printing Company Limited; Shin-Etsu Chemical Company Limited, both of Tokyo, Japan

[22] Filed: Mar. 30, 1976

[21] Appl. No.: 671,737

[30] Foreign Application Priority Data

Apr. 14, 1975 Japan .................. 50-4969

[52] U.S. Cl. .................. 96/33; 96/35.1; 96/36.3; 96/86 P; 96/115 R; 96/115 P; 101/453; 101/456; 101/465; 204/159.13; 260/46.5 E

[51] Int. Cl.² .................. G03F 7/02; G03C 1/68

[58] Field of Search .......... 96/33, 35.1, 86 P, 36.3, 96/115 R, 115 P; 101/453, 456, 465; 204/159.13, 159.18; 260/46.5 R, 46.5 E

[56] References Cited

UNITED STATES PATENTS

| | | | |
|---|---|---|---|
| 3,758,306 | 9/1973 | Roos | 96/115 R X |
| 3,775,115 | 11/1973 | Sorkin et al. | 96/33 |
| 3,782,940 | 1/1974 | Ohto et al. | 96/35.1 X |
| 3,816,282 | 6/1974 | Viventi | 204/159.13 |
| 3,886,865 | 6/1975 | Ohto et al. | 101/456 |
| 3,887,636 | 6/1975 | Juliano et al. | 260/46.5 E X |
| 3,890,149 | 6/1975 | Schlesinger et al. | 96/115 R X |

Primary Examiner—Edward C. Kimlin
Attorney, Agent, or Firm—Toren, McGeady and Stanger

[57] ABSTRACT

The planographic printing plate has ink-receptive and ink-repellent areas provided on its base, the ink-repellent areas being covered with a layer formed by polymerizing and curing a composition which comprise a photopolymerizable organopolysiloxane with maleimido groups. The photopolymerizable organopolysiloxane has easily synthesized. The ink-repellency of the cured organopolysiloxane is excellent. The planographic printing plates can be used without dampening water and have a superior press life.

23 Claims, 4 Drawing Figures

PLANOGRAPHIC PRINTING PLATES AND A METHOD OF PREPARING THEM USING PHOTOPOLYMERIZABLE ORGANOPOLYSILOXANES WITH MALEIMIDO GROUPS

BACKGROUND OF THE INVENTION

The present invention relates to planographic printing plates for use in dry planography in which the conventional use of dampening water is obviated. The invention also relates to a method for preparing such printing plates.

Planographic printing, unlike letter-press or gravure printing, is carried out by use of printing plates of planographic type, i.e., not containing raised or depressed areas as the ink-holding areas but containing image and non-image areas provided substantially on the same plane. The ordinary process of planographic printing which is based on the principle that water and oil-based printing ink are immiscible to each other, comprises the following steps.

1. Non-image areas are rendered hydrophilic by a chemical or mechanical treatment, while image areas are made ink-receptive by application of an oleophilic resin by means of transferring or photographic techniques.

2. The printing plate is dampened with water, thus the hydrophilic non-image areas becoming wet while the oleophilic image areas repelling the dampening water.

3. Then, the plate is inked, leaving a film of ink on the image areas only, so that this film of ink can be transferred imagewise to another surface brought into contact therewith, such as paper.

The disadvantages experienced in the practice of the conventional planographic printing process are, for example, firstly that the dampening water applied to the plate may flow back to the inking rollers on the press during printing operations, whereby the ink becomes emulsified causing soiling to the paper sheet, secondly that the dampening water transferred to the printing material may be a cause of its dimensional changes, being of a serious problem especially in multiple color printing where the accurate registration of different colors is essential, and thirdly that the stability or uniformity in color tone is sometimes unsatisfactory due to difficulties encountered in securing delicate balance between the amounts of the dampening water and of the ink to be used.

In order to overcome the above-described disadvantages, various attempts were made for the develment of planographic printing processes in the absence of the dampening water, but no satisfactory results were obtained. According to one example of the attempts, a planographic printing plate was prepared by forming a layer of a composition with a photosensitive diazo compound on the base of, say, aluminum and overlying a layer of dimethylpolysiloxane gum. The plate was overlaid with a nagative transparency and exposed to light to insolubilize the photosensitive diazo layer in the exposed areas, followed by development by washing away the diazo composition from the unexposed areas and finished by removing the layer of the dimethylpolysiloxane gum off the unexposed areas, leaving the layer of the dimethylpolysiloxane gum imagewise on the exposed areas corresponding to the non-image areas owing to the ink-repellency of the siloxane gum (see British patent specification No. 1,146,618).

Another example of the past attempts was such that a planographic printing plate was prepared by providing on a substrate of, say, aluminum successive layers of a photosensitive diazo composition, an adhesive and a silicone rubber, and overlaying the thus prepared plate was a positive transparency, followed by exposure to light to decompose the photosensitive diazo compound on the exposed areas and stripping the silicone rubber layer imagewise on the exposed areas (see U.S. Pat. No. 3,511,178).

The prior art planographic printing plates referred to above were found defective in some important points. For example, the intervention of the silicone rubber layer between the photosensitive diazo layer and the positive or negative transparency made it difficult to perform the imagewie exposure of the photosensitive layer with high image fidelity. As another example, the image patterns formed by the silicone rubber layer left behind did not always exhibit satisfactory sharpness at their edges, since the stripping of the silicone rubber layer was carried out relying on the change of the solubility of the layer in a solvent. As a further example, the processing of the prior art planographic printing plate was complicated because of the necessity of providing a plurality of layers successively onto a substrate before subjecting to exposure to light and developing.

The inventors of the present invention then performed extensive investigations with the purpose to produce planographic printing plates free from the above described problems. As a result, such planographic printing plates were proposed that had a single layer of a photopolymerizable composition composed of a photopolymerizable organopolysiloxane, a photosensitizer and a solvent, on their aluminum or other bases or substrates. The printing plate was mounted in contact with a transparency of positive patterns, and exposed to light to photopolymerize the organopolysiloxane on the exposed areas thereby to convert to an insoluble, cured film having excellent strength, ink-repellency, heat-stability, chemicals resistance and anti-corrosiveness, followed by development with a solvent to wash the organopolysiloxane layer of the unexposed areas, leaving the cured organopolysiloxane layer imagewise on the exposed areas (see Japanese Pat. No. 33,910/1973).

However, the above planographic printing plates were then found defective in that the photopolymerizable organopolysiloxane was not sufficiently compatible with the photosensitizer, resulting in the precipitation of the latter ingredient from the former within the layer formed and consequently in resulting in the lowering of the photosensitivity of the composition.

In order to provide a remedy for the abovedescribed defects, the same inventors then proposed renewed planographic printing plates in which the photosensitive layer was composed of a photopolymerizable organopolysiloxane and a silicon-containing benzophenone derivative as a photosensitizer. These new printig plates were suitable for a similar processing to the old one and advantaged in that the compatibility inherent between the silicon-containing benzophenone derivative and the photopolymerizable organopolysiloxane served to reduce the precipitation of the photosensitizer from the organopolysiloxane, and the lowering of the photosensitivity or the occurrence of fogging due to heat could be prevented even on prolonged storage before exposure to light. The printing plates were found quite useful in planography in the absence of dampening water, with the resulting prints being sharp and precise.

Despite the improvement achieved by the silicon-containing benzophenone derivative as a photosensitizer was remarkable, there was still the questions unsolved as to the compatibility of the photosensitizer with the photopolymerizable organopolysiloxane which was not sufficient and the precipitation of the former from the latter which worked to lower the photosensitivity.

Under the circumstances, the inventors of the present invention proposed a further improvement such that the possibility of the precipitation of the photosensitizer from the organopolysiloxane should be completely eliminated by the use of a self-sensitizing photopolymerizable organopolysiloxane having both photopolymerizable and photosensitizing groups in a molecule. However, such self-sensitizing photopolymerizable organopolysiloxane have encountered difficulties in the manner of synthesizing them wherein it is required to make the organopolysiloxane effectively react with the groups having the photopolymerizing and photosensitizing properties.

SUMMARY OF THE INVENTION

It is therefore an object of this invention to provide planographic printing plates whose preparation or use is free of one or more of the abovedescribed difficulties or disadvantages encountered in the preparation and use of the prior art products. Another object of the invention is to provide a method for making them.

In accordance with the invention, the planographic printing plates comprises a base or substrate having ink-receptive areas and ink-repellent areas thereon, wherein the ink-repellent areas are covered by a cured and hardened layer of a novel photopolymerizable organosilicon compound containing no photosensitizer.

The photopolymerizable organosilicon compound useful in the present invention is an organosilane or an organopolysiloxane represented by the average unit formula

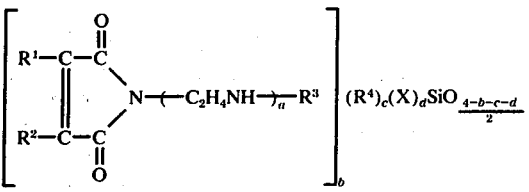

(I)

where $R^1$ is a monovalent aromatic group or a monovalent heterocyclic group, $R^2$ is a hydrogen atom, a halogen atom, a cyano group or a monovalent hydrocarbon group with 1 to 4 carbon atoms, $R^3$ is a divalent hydrocarbon group with 1 to 10 carbon atoms, $R^4$ is a monovalent hydrocarbon group, X is a hydroxy group or a hydrolyzable group, $a$ is 0 or 1, and $b$, $c$ and $d$ each are numbers expressed by $0 < b \leq 1$, $0 \leq c \leq 3$ and $0 \leq d \leq 3$, respectively, with the proviso that $0 < (b+c+d) \leq 4$.

These organosilicon compounds are readily synthesized and can be a suitable photosensitive material for the preparation of planographic printing plates of the present invention since they exhibit excellent photopolymerizability without any photosensitizer.

Naturally, the properties of merit in the planographic printing plates of the invention largely depend upon the structure of the individual organosilicon compounds, being organosilanes when $b+c+d$ is equal to 4 or organopolysiloxanes when $b+c+d$ is smaller than 4. In particular, the photosensitivity of the organopolysiloxane depends on the amount of the photosensitizing groups, namely the maleimido group-containing organosiloxane units expressed by the following formula where $a$ is 0 or 1.

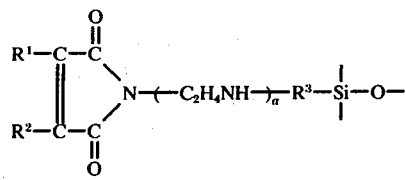

However, it is noticeable that increased amounts of the maleimido group-containing organosiloxane units lead to reduction in the hardness of the cured layer of the photopolymerizable composition containing the organopolysiloxane, and the plate provided with such a layer of reduced hardness should be handled with great care not to cause scratches on the surface thereof against a transparency in contact therewith during the step of exposure to light. Moreover, a high content of the maleimido groups in the organopolysiloxane units results in the formation of layers that exhibit inferior ink-repellency.

Further, press life is of practical importance to printing plates. It has a close relationship with the molecular weight of the photopolymerizable organopolysiloxane; that is to say, a lower molecular weight tends to give shorter press life.

Having taken the above into consideration, it is further established that the planographic printing plates of the present invention have on the non-image area a cured layer of a self-sensitizing photopolymerizable organopolysiloxane expressed by the average formula

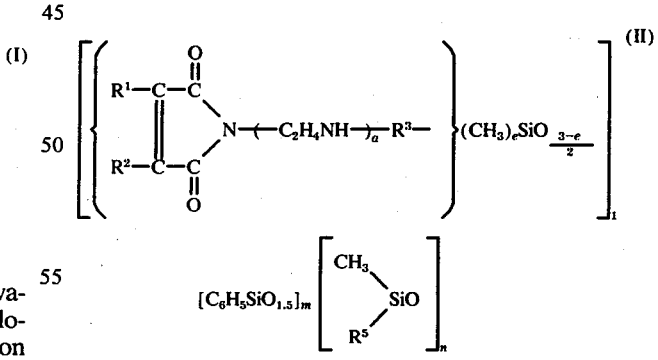

where $R^1$, $R^2$ $R^3$ and $a$ each have the same meanings as defined above, $R^5$ is a methyl or 3,3,3-trifluoropropyl group, $e$ is 0 or 1, and 1, $m$ and $n$ each are positive numbers with the proviso that $n$ is not less than 25, $n/l$ is 25 to 2,000 and $n/m$ is 2.5 to 50.

The planographic printing plates bearing the layer of this particular self-sensitizing photopolymerizable organopolysiloxane can be handled with a less possibility of causing scratches thereon, and have a longer press life in printing without dampening water to produce very sharp prints with precision and high resolving power.

DETAILED DESCRIPTION OF THE PREFERRED EMBODIMENTS

Figure 1:
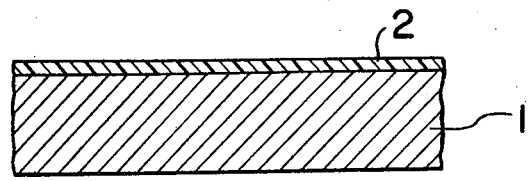
FIG. 1 represents a sectional view of the planographic printing plate showing the base or substrate and the overlayer of a photopolymerizable organosilicon compound.
Figure 2:
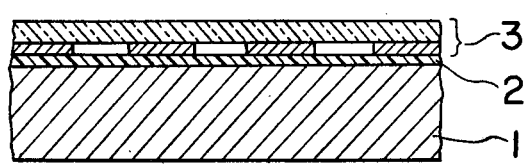
FIG. 2 represents a sectional view illustrating the exposure of the planographic printing plate to light through a transparency.
Figure 3:
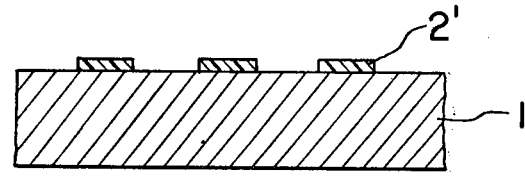
FIG. 3 represents a sectional view showing the exposed and developed plate.
Figure 4:
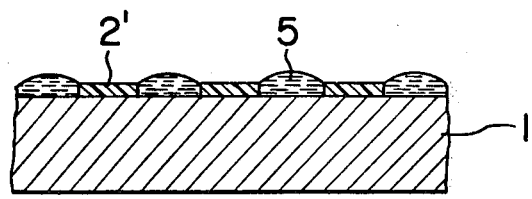
FIG. 4 represents a sectional view showing the inked plate of the present invention.

The new planographic printing plate of the present invention and the method of preparing the plate are more easily understood by reference to FIGS. 1-4. FIG. 1 shows a substrate 1 coated on one surface thereof with a layer 2 of the sensitizer-free photopolymerizable organosilicon compound. Layer 2 is formed by applying the photopolymerizable organosilicon compound, optionally as a solution in a suitable organic solvent, followed by drying, to achieve a 3 to 10 μm thickness. FIG. 2 shows the imagewise exposure of layer 2 by ultraviolet light or intense visible light 4 through a transparency 3 having positive patterns, such as, letters, symbols, figures, pictures and the like, which is laid over layer 2 in an intimate contact. The printing plate thus exposed is then subjected to developing and fixing to produce a finished one as illustrated in FIG. 3 wherein areas 2' (ink-repellent) of layer 2 of the photopolymerized and cured organosilicon compound, having excellent heat-resistance and chemical resistance, are left imagewise on the exposed areas, while the unpolymerized organosilicon compound on the unexposed areas has been washed out during the development step with an organic solvent, the resultant naked surfaces of substrate 1 constituting ink-receptive areas. FIG. 4 shows the printing plate with printing ink 5 in the ink-receptive areas.

The substrate materials suitable for use in the printing plates of the present invention may be of any of those representatively including metal sheets, such as, copper, aluminum, zinc, iron, brass and stainless steel, and various kinds of plastics. It is preferred that the surface of the substrate is, prior to the application of the photopolymerizable organosilicon compound, cleaned by suitable means and, if necessary, coated with a primer, such as, vinyl tris(2-methoxyethoxy)silane, 3-glycidyloxypropyl trimethoxysilane, 3-methacryloxypropyl trimethoxysilane, N-(trimethoxysilylpropyl)ethylenediamine, 3-aminopropyl triethoxysilane or partial hydrolyzates of one or a mixture of those silanes. Such primer coating may be carried out by any suitable coating method, for example, roller coating, rod coating, brush coating or spray coating.

The photopolymerizable organosilicon compounds used in the present invention are free from the inclusion of any photosensitizers which is thought to be a cause of various troubles. Suitable organosilicon compounds are selected from the organosilanes and organopolysiloxanes represented by the afore-mentioned formula (I), which are advantaged by their excellent properties and by the fact that they can be easily synthesized.

When the organosilicon compound represented by formula (I) is an organopolysiloxane with the value of $b+c+d$ smaller than 4, it may involve, besides the maleimido ring-containing siloxane units, the siloxane units represented by the formula

where $R^6$ is a monovalent hydrocarbon group with 1 to 10 carbon atoms, Z is a hydroxy or a hydrolyzable group and f and g each are zero or a positive number not exceeding 3 with the proviso that $f+g$ is a number smaller than 4.

The photopolymerizable organopolysiloxane of formula (I) may have a molecular configuration of linear chain, branched chain or cyclic ring, and its photopolymerizability is substantially not affected by its rheological property no matter what it may include a fluid, a rubbery elastomer and a resin.

The photopolymerizable organopolysiloxane represented by formula (I) may be prepared by various synthetic methods, for exmple, by the reaction of a maleic anhydride derivative represented by the general formula

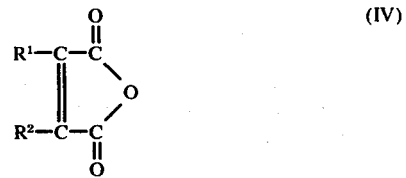

where $R^1$ and $R^2$ each have the same meaning as defined previously for the formula (I), and an organosilane or an organopolysiloxane represented by the formula

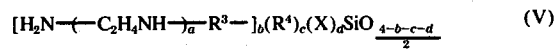

where $R^3$, $R^4$, X, a, b, c and d each have the same meaning as defined previously for formula (I).

Further, when the organopolysiloxane represented by formula (I) involves the organosiloxane units represented by formula (III), an organopolysiloxane represented by the formula

where R, Z and f each are the same as defined before and g' is a positive number larger than g and smaller then 4, is cocondensed with the organosilicon compound (V) either before or after the reaction with the maleic anhydride derivative (IV).

The symbols X and Z in the formulas (III) and (V) each denote a hydroxy or a hydrolyzable group. The hydrolyzable groups denote by X or Z include halogen atoms, such as, chlorine and bromine atoms, alkoxy groups, such as, methoxy, ethoxy and propoxy groups and acyloxy groups, such as, acetoxy and propionyloxy groups, which may be hydrolyzed to form hydroxy groups directly bonded to the silicon atoms. It is well known by those skilled in the art that a siloxane linkage is formed by the condensation between these two hydroxy groups or between the hydroxy group and the hydrolyzable group with the elimination of a molecule of water, hydrogen halides, alcohols or carboxylic acids.

In the course of the reaction of the maleic anhydride derivative of formula (IV) and the organosilicon compound of formula (V) to form the photopolymerizable organosilicon compound of formula (I), an intermediate compound with amide structure represented by the formula

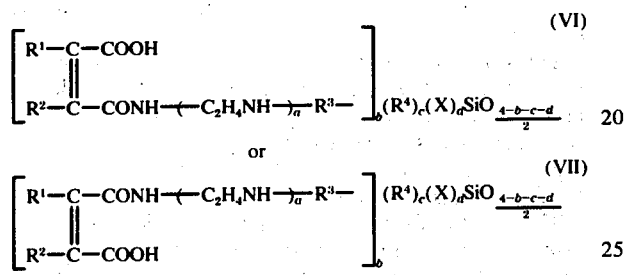

where $R^1$, $R^2$, $R^3$, $R^4$, X, a, b, c and d each have the same meaning as above, is first produced, and then converted to the compound of formula (I) by intramolecular dehydration condensation forming a maleimido ring.

The above reaction is advantageously carried out in a solution with an organic solvent. The solvents suitable for the purpose are exemplified by aromatic hydrocarbons, such as, benzene, toluene and xylene and certain polar solvents, such as dimethylformamide, diethylformamide, dimethylsulfoxide and diethylsulfoxide. The reaction takes place readily when the reactants are mixed together under agitation in the solvent, proceeding in two steps.

The first step is the formation of the intermediate compound of formula (VI) or (VII) taking place even at room temperature, viz., 20° to 30° C. The second step is the conversion of the maleimido ring to the compound of formula (I) by intramolecular dehydration taking place at an elevated temperature, say, above 50° C, preferably, from 50° to 100° C. The molar ratio of the reactants (IV) and (V) in the mixture is preferably such that the amount of the maleic anhydride derivative (IV) is from 0.1 to 1.2 moles per mole of the amino groups in the organosilicon compound (V).

The reaction of intramolecular dehydration or maleimido ring formation is further catalytically accelerated by the presence of certain anhydrides of aliphatic or aromatic carboxylic acids or tertiary amines. Illustrative of the anhydrides of aliphatic carboxylic acids are acetic, propionic, butyric and valeric anhydrides. Illustrative of the anhydrides of aromatic carboxylic acids are anhydrides of 2-,3- and 4-ethylbenzoic acids, 4-propylbenzoic acid, anisic acid, 2-, 3- and 4-nitrobenzoic acids, isomers of dimethylbenzoic acids, e.g., hemellitic acid, 3,4-xylylic acid and mesitylenic acid, 2,4,6-trimethoxybenzoic acid, α- and β-naphthoic acids, biphenylcarboxylic acids and the like. Further illustrative of the tertiary amines are pyridine, dimethylpyridine, N,N-dimethylaniline, triethylamine, N,N-dimethylbenzylamine and the like. These compounds may be present in a catalytic amount, but it is optional to use them in a large amount such that they may serve as a reaction medium.

The component shown by formula (III) above is an organosilane or an organopolysiloxane, depending upon the value of $f+g$. The organosilanes, when the value of $f+g$ is equal to 4, are exemplified by chlorosilanes, such as, silicon tetrachloride, methyltrichlorosilane, dimethyldichlorosilane, trimethylchlorosilane, vinyltrichlorosilane, vinylmethyldichlorosilane, vinyldimethylchlorosilane, phenyltrichlorosilane, phenylmethyldichlorosilane, phenyldimethylchlorosilane, diphenyldichlorosilane, diphenylmethylchlorosilane, and those silanes which are derived from the above-mentioned chlorosilanes by the substitution of part or all of the chlorine atoms with other halogen atoms than chlorine, alkoxy groups, acyloxy groups or hydroxy groups.

On the other hand, component (III) being an organopolysiloxane, with the value of $f+g$ smaller than 4, can be prepared from the above-mentioned various silanes by a conventional manner. For example, predetermined amounts of one or more of the silanes are subjected to hydrolysis separately or as a mixture, followed by condensation reaction to form siloxane linkages with the elimination of molecules of water, hydrogen halides, alcohols or carboxylic acids. The rheological property of component (III) may be any of fluid, gum and resin and its molecular configuration may be of a straight chain, branched chain or cyclic ring. The molecular weight of the organopolysiloxane suitable as component (III) may range widely from that corresponding to the number of the silicon atoms only two or three to that corresponding to some tens of thousands, according to uses of final products.

With respect of the organosilane or organopolysiloxane of formula (V), $R^3$ in the formula represents divalent hydrocarbon groups with 1 to 10 carbon atoms, exemplified by alkylene groups, such as, methylene, ethylene and propylene groups, arylene groups, such as, phenylene group and alkarylene groups, such as, phenethylene group; $R^4$ represents monovalent hydrocarbon groups, exemplified by alkyl groups, such as, methyl, ethyl and propyl groups, aryl groups, such as, phenyl group, aralkyl groups, such as, benzyl and phenylethyl groups, alkaryl groups, such as, styryl and tolyl groups, alkenyl groups, such as, vinyl and allyl groups and cycloalkyl groups, such as, cyclohexyl group, and X represents hydroxy groups of hydrolyzable groups, exemplified by halogen atoms, alkoxy groups and acyloxy groups.

The organosilanes of formula (V) with the value of $b+c+d$ equal to 4 are exemplified by 3-aminopropyltriethoxysilane, 3-aminopropylmethyldimethoxysilane, N-(2-aminoethyl)-3-aminopropylmethyldimethoxysilane and N-(2-aminoethyl)-3-aminopropyl trimethoxysilane, each having at least one amino group and at least one hydroxy or hydrolyzable group simultaneously in a molecule.

The organopolysiloxanes of formula (V) with the value of $b+c+d$ is smaller than 4 are expressed for example, by the following structural formulas.

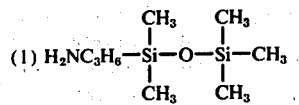

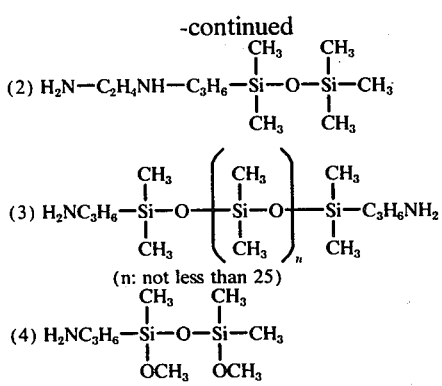

Turning now to the maleic anhydride derivatives of formula (IV), $R^1$ in the formula represents monovalent aromatic or heterocyclic groups, exemplified by aryl groups, such as, phenyl, tolyl, xylyl, biphenylyl and naphthyl groups and substituted aryl groups derived from the above-mentioned aryl groups by nuclear substitution with a substituent, such as, nitro group, alkoxy groups and halogen atoms and heterocyclic groups, such as, thienyl, furyl and pyridyl groups; and $R^2$ in the formula denotes a hydrogen atom, halogen atom, cyano group, alkyl groups, such as, methyl, ethyl, propyl and butyl groups and alkenyl groups, such as, vinyl and allyl groups.

Examples of the maleic anhydride derivatives are phenyl maleic anhydride, tolyl maleic anhydride, α-phenyl-β-methylmaleic anhydride, α-phenyl-β-cyanomaleic anhydride, α-phenyl-β-chloromaleic anhydride, naphthylmaleic anhydride, furyl maleic anhydride, thienyl maleic anhydride and pyridyl maleic anhydride.

The maleimido rings in the organopolysiloxane formed by the reaction of the maleic anhydride derivative with the amino group-containing organopolysiloxane contribute to the photopolymerizability of the organopolysiloxane. However, the presence of too many maleimido rings gives adverse effects to the properties of the organopolysiloxane and consequently to the characteristics of the finished planographic printing plates. Thus, the layer of the organopolysiloxane on substrate before exposure to light may be some chance be relatively soft and liable to cause many scratches on the surface thereof, though the plate is handled with utmost care, during the process of the exposure through the transparency in intimate contact under reduced pressure, resulting in insufficient clearness of prints. Further, the cured layer of the photopolymerized organopolysiloxane has rather a poor ink-repellency when it contains too many maleimido rings.

On the other hand, the molecular weight of the photopolymerizable organopolysiloxane is in close relationship with the press life of finished printing plates; a lower molecular weight tends to result in poorer press life.

It is therefore desirable from the practical point of view that a good balance be established among the following properties, viz. (1) the hardness or mechanical strengths of the coating layer, which should be sufficient to prevent the occurrence of scratches, (2) the photopolymerizability of the organopolysiloxane enough to form photopolymerized and cured films by a relatively small exposure dose of light in terms of the intensity of ultraviolet or visible light multiplied by exposure time, (3) the ink-repellency of the photopolymerized and cured film after exposure, developing and fixing to such an extent that no dampening water is necessary, and (4) the press life of finished printing plates with sufficient mechanical strengths and wear resistance.

In view of the balance of properties as described above, the photopolymerizable organopolysiloxane represented by formula (I) should be further restricted with respect to the contents of various organic groups bonded to the silicon atoms including the maleimido ring-containing groups, as well as the molecular weight. Most preferred photopolymerizable organopolysiloxanes are those represented by formula (II) which are capable of attaining a good balance of properties from the standpoint of use for the planographic printing plate of the present invention.

It is needless to say that the structure unit represented by the formula

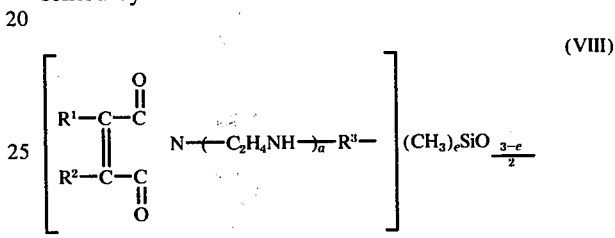

is a component which imparts photopolymerizability to the organopolysiloxane without any photosensitizer, while the structural unit represented by the formula

is a component which imparts hardness along with decreased tackiness to the coating layer before exposure to light or ink-repellency to the cured layer of the organopolysiloxane, respectively.

The numerical values of $l$, $m$ and $n$ in formula (II) are the determining factors for the above-described balance of properties and especially for press life. The value of $n$ is preferably as high as possible and should be 25 or larger in order to obtain a good ink-repellency of the photopolymerized and cured layer on the non-image areas and a sufficiently long press life.

The hardness and tackiness of the organopolysiloxane layer on substrate before exposure to light are determined by the value of $n/m$, which is in the range from 2.5 to 50, preferably, from 5 to 25 for a good balance of the properties. Thus, any larger values of $n/m$ result in a better ink-repellency but, more disadvantageously, result in the poor hardness of the layer before exposure, which will cause the occurrence of scratches to the layer surface during the process of contacting a transparency. On the other hand, any smaller values of $n/m$ result in an insufficient ink-repellency and a poorer durability of the photopolymerized and cured layer of the organopolysiloxane after exposure, developing and fixing.

Further, the value of $n/l$ is in the range from 25 to 2,000, preferably, from 50 to 1,000, since $n/l$ is the determining factor for the photosensitivity of the photopolymerizable organopolysiloxane and the ink-repellency of the photopolymerized layer of the organopolysiloxane. Thus, any smaller values of n/l result in a higher photosensitivity but a lower ink-repellency and durability, while any larger values of n/l result in a lower photosensitivity but a lower ink-repellency.

The preparation of the photopolymerizable organopolysiloxane represented by formula (II) is carried out by subjecting an organosilicon compound represented by the formula

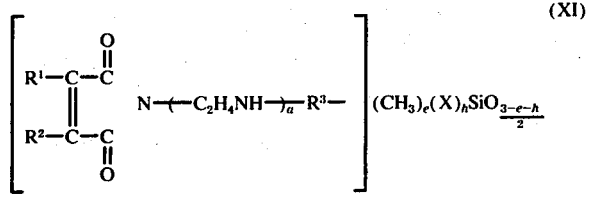
(XI)

where $R^1$, $R^2$, $R^3$, X, a and e each have the same meaning as defined before and h is a positive integer with the proviso that (e+h) 3, to copolymerization with the organopolysiloxane composed of the siloxane units of formulas (IX) and (X).

The organosilicon compound of formula (XI) is obtained by the reaction of a maleic anhydride derivative (IV) with an organosilicon compound represented by the formula

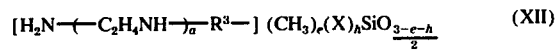
(XII)

where $R^3$, X, a, e and h are the same as above. The examples of the organosilicon compounds are 3-aminopropyltrimethoxysilane, 3-aminopropylmethyldimethoxy silane, N-(2-aminoethyl)-3-aminopropyltrimethoxysilane, N-(2-aminoethyl)-3-aminopropylmethyldimethoxysilane and silanes having one or more hydroxy groups and one or more amino containing groups simultaneously when e+h is equal to 3, and organopolysiloxanes as the partial hydrolysis-condensate of these silanes when e+h is smaller than 3.

It is readily understood that the reaction of the maleic anhydride derivative (IV) and the organosilicon compound (XII) proceeds with the formation of an intermediate with a similar amide structure as (VI) or (VII).

The copolymerization of the organosilicon compound (XI) with the organopolysiloxane composed of the siloxane units (IX) and (X) is carried out in several different methods as follows.

a. A mixture of silanes selected from dimethyldichlorosilane, methyl trifluoropropyldichlorosilane, phenyltrichlorosilane and the silane represented by formula (XI) with e+h equal to 3 is cohydrolyzed, and the resulting hydrolyzate is subjected to cocondensation reaction to form a polysiloxane with a desired degree of polymerization.

b. A mixture of dimethyldichlorosilane, methyl trifluoropropyldichlorosilane and phenyltrichlorosilane is cohydrolyzed, and to the hydrolyzate is added an alkoxysilane represented by formula (XI) where e+h is equal to 3 and X denotes an alkoxy group. The resulting mixture is subjected to cocondensation to form a polysiloxane with a desired degree of polymerization.

c. A linear diorganopolysiloxane terminated at both chain ends with chlorine atoms and represented by the formula

(XIII)

and hydrolyzate of phenyltrichlorosilane are brought to dehydrochlorination reaction in the presence of an acceptor of hydrogen chloride. The resulting block copolymer is subjected to cocondensation with an alkoxysilane represented by formula (XI) to form a polysiloxane with a desired degree of polymerization.

d. The same chlorine-terminated diorganopolysiloxane as in (c) above and the cohydrolyzate from phenyltrichlorosilane and the silane represented by formula (XI) with e+h equal to 3 are brought to condensation reaction to form a polysiloxane with a desired degree of polymerization.

e. A diorganopolysiloxane fluid terminated at both chain ends with hydroxy groups and represented by the formula

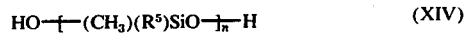
(XIV)

is mixed with a hydrolyzate of phenyltrichlorosilane and the silane represented by formula (IX) or a hydrolyzate thereof, and the mixture is brought to condensation reaction to form a polysiloxane with a desired degree of polymerization.

f. The same hydroxy-terminated diorganopolysiloxane fluid as in (e) above is subjected to reaction with phenyltrichlorosilane in the presence of an acceptor of hydrogen chloride, and the reaction product is hydrolyzed, followed by cocondensation reaction with the silane represented by formula (XI) or a hydrolyzate thereof, to form a polysiloxane with a desired degree of polymerization.

The photopolymerizable organopolysiloxanes have a wide variety of molecular structures depending upon the individual organosilanes or organopolysiloxanes as the reactants and the maleic anhydride derivatives. For example, the use of an ethoxycontaining organosilane as the reactant gives photopolymerizable organosilicon compounds having ethoxy groups in the molecule. Such organosilicon compounds having ethoxy groups are applicable for the preparation of the planographic printing plate of the present invention without further modification. If necessary, however, there are given possibilities of obtaining further improved organosilicon compounds modified, for example, by the dehydration or dealcoholation condensation of the ethoxy-containing organosilicon compounds with various kinds of linear, branched or cyclic organopolysiloxanes having an alkoxy or hydroxy group or groups bonded to the silicon atoms in a molecule. This modification reaction is carried out in the solvent, such as, aromatic hydrocarbons (e.g., toluene and xylene) and polar organic solvents (e.g., tetrahydrofuran and dimethylformamide) in the presence of a catalyst, such as, an organotin compounds, an organozinc compounds or p-toluenesulfonic acid, at 50° to 150° C.

The transparency through which the layer of the photopolymerizable organosilicon compound is exposed imagewise to light is made of a photographic plate or film having a silver halide emulstion layer thereon, as shown in FIG. 2. The transparency has positive patterns with respect to the images to be printed so that unexposed areas on the plate will become the image areas in the printing.

As the light source for the exposure are useful any lighting lamps insofar as their intense radiation is sufficient. Preferred light source may be those emitting radiation rich in ultraviolet light, such as, xenon lamps and low- and high-pressure mercury lamps.

The exposure step shown in FIG. 2 is carried out preferably in a reduced pressure chamber. It is also possible to use a sealed transparent plastic bag under reduced pressure in which the plate and the transparency are contained and from outside of which light is applied. It either case, the reduced pressure condition works to give an intimate contact to the plate and the transparency as well as to avoid any possible undesirable effects by oxygen in air.

The developing liquid with which the unpolymerized areas of the organopolysiloxane layer are washed is an organic solvent, such as, aliphatic and aromatic hydrocarbons, chlorinated hydrocarbons and ketones, exemplified by toluene, xylene, cyclohexane, methylethylketone, methylisobutylketone, trichloroethylene and tetrachloroethylene, either singly or as a mixture of two or more.

The fixing step after the development step is undertaken when it is desired that the cure of the photopolymerized layer is brought to further completeness. The fixing may be performed by merely heating the plate after development. Most preferred manner of fixing is to re-expose the developed layer to light, the reason for which is given as follows.

In the preperation of planographic printing plates of the conventional type in which a photopolymerizable resin admixed with a photosensitizer is used, the photosensitizer ingredient is washed away with a solvent during the developing process, and the resulting resin composition becomes to reduce its photopolymerizability. In order to remedy this defect, there is required the fixing process which is carried out by no other ways but heating. The heating of the plates as a whole at an elevated temperature has a tendency to cause several undesirable effects, for example, distortion or dimensional changes of the printing plates and the oxidation of materials.

To contrast, the self-sensitizing photopolymerizable organosilicon compound used in preparation of the planographic printing plates of the present invention dispenses with the inclusion of any photosensitizers and, as a result, re-exposure after development is fully effective as the fixing means to crosslink the organosilicon compound completely, leading to further improvement of press life.

Layer 2' of the photopolymerized organopolysiloxane on the non-image areas shown in FIG. 3 has a very high ink-repellency and a low adhesivity, so that a cohesive force between the photopolymerized layer on the non-image areas and the printing ink supplied from the inking roller to the plate is much lower than between the printing ink and the inking roller or between the molecules of the ink themselves. Therefore, the printing ink is transferred only to the naked areas of substrate 1 on the image areas to form inked areas 5, and no ink is transferred to the nonimage areas, thus obviating the use of the dampening water.

For summarization, the planographic printing plate of the present invention can be prepared very simply by first coating the surface of its base or substrate with a photopolymerizable organosilicon compound, drying the coating, mounting a transparency with positive patterns in contact with the dried layer of the coating, and then subjecting the composite to exposure to light, followed by development and fixing. This simple method is advantageously contributable to the commercialization of the printing plates of the present invention. Further, the images formed directly on substrate are clear and sharp from edge to edge with an excellent resolving power and high fidelity.

A further advantage of the planographic printing plates of the present invention lies in their excellent printability due to the large difference in the physical properties of surfaces existing between the image areas with naked underlying surface and the non-image areas with the photopolymerized and cured layer of the organosilicon compound having a high ink-repellency.

The above described advantages of the planographic printing plates of the present invention are fully realized by use of the photopolymerizable organosilicon compound formula (I) or, especially, (II) composed of three different siloxane units (VIII) to (X) in controlled amounts, respectively imparting effects to the well-balanced processability and properties of finished products, viz., hardness of the unexposed coating layer, photopolymerizability and ink-repellency as well as press life.

Following are examples to illustrate the present invention but not to limit the scope of the invention. In the examples all parts are parts by weight and Me, Et and Ph denote methyl, ethyl and phenyl groups, respectively.

EXAMPLE 1

A solution containing 260 g of dimethyldichlorosilane and 50 g of phenyltrichlorosilane in 1,000 g of toluene was added dropwise to 1,100 g of water at a temperature not exceeding 25° C. The resultant cohydrolyzate solution was washed with water, neutralized and dehydrated to give a 15% by weight solution of an organopolysiloxane in toluene. To 1,000 g of this solution were added 5 g of 3-aminopropyltriethoxysilane and 0.2 g of dibutyltin dioctoate, and the mixture was subjected to de-ethanolation condensation taking place between the organopolysiloxane and 3-aminopropyltriethoxysilane under reflux for 2 hours, resulting to form a toluene solution of an organopolysiloxane with 3-aminopropyl groups expressed by the following formula in an average.

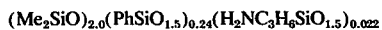

$(Me_2SiO)_{2.0}(PhSiO_{1.5})_{0.24}(H_2NC_3H_6SiO_{1.5})_{0.022}$

Then, 3.94 g of phenylmaleic anhydride, corresponding to the equimolar amount to the 3-aminopropyl groups, dissolved in 10 ml of dimethylformamide was added dropwise at 20° C to the above-obtained toluene solution of the organopolysiloxane. This reaction was continued at 25° C for 1 hour, and thereafter at 110° C for another 4 hours, steadily removing the water produced by the condensation reaction out of the reaction mixture to form a maleimido group-containing organopolysiloxane expressed by the following formula, in an average, as supported by the infrared absorption spectroscopy.

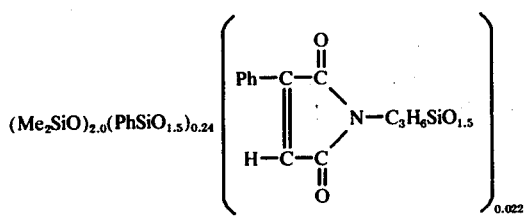

This organopolysiloxane was a solid having a softening point of 110° to 120° C and a viscosity of 8.9 centistokes in a 15% solution in toluene at 25° C.

An aluminum sheet was coated with the above solution of the organopolysiloxane to a coating amount of 5 g/m² as solid. The thus coated aluminum sheet was dried to be free of toluene, overlaid with a transparency with positive patterns in an intimate contact under reduced pressure, irradiated for 30 seconds through the transparency with light from a 3-kW superhigh pressure mercury lamp 40 cm apart, and developed with xylene to make a dry-planographic printing plate of the present invention.

Printing test was undertaken with this printing plate set to a printing press of Model KOR made by Heidelberg Co. without the wetting rod, to produce satisfactorily sharp prints.

In parallel with the above test, the plate coated with the organopolysiloxane was kept in an air oven at 60° C for more than 800 hours, to find no decreases in photosensitivity or thermal fogging and to the excellent stability of the organopolysiloxane.

EXAMPLE 2

Into a solution of 17.4 g of α-phenylmaleic anhydride in 100 g of toluene was dropped 22.1 g of 3-aminopropyl triethoxysilane at room temperature, and the reaction was continued for 1 hour at 25° C. Then, the reaction mixture was heated under reflux for 3 hours to give a toluene solution of a mixture of maleimido-containing organopolysiloxanes expressed by the following formula

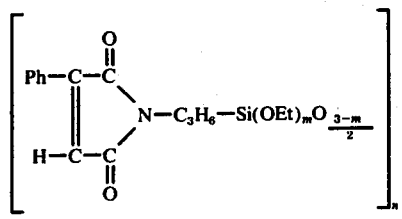

where $m$ was 1 or 2 and $n$ was 2 or 3. These organopolysiloxanes had a melting point of about 64° to 65° C.

On the other hand, 2.36 g of pyridine and 743 g of a 20% solution in toluene of a dimethylpolysiloxane with an average degree of polymerization about 200 terminated by chlorine atoms at both chain ends were dropped into 194 g of a 20% solution in toluene of the hydrolyzate of phenyltrichlorosilane giving rise to dehydrochlorination reaction by agitating for about 1 hour. The resultant reaction mixture was washed with water to be free of the pyridine hydrochloride formed and any remaining pyridine and dehydrated into a solution of copolymerized organopolysiloxane with 20% of siloxane content.

To this solution were added a portion of the toluene solution prepared above containing 20 g of the organopolysiloxane with maleimido groups and 0.1 g of dibutyltin dioctoate and the mixture was heated under reflux of toluene for 5 hours resulting in a solution of a maleimido-containing organopolysiloxane expressed by the following formula.

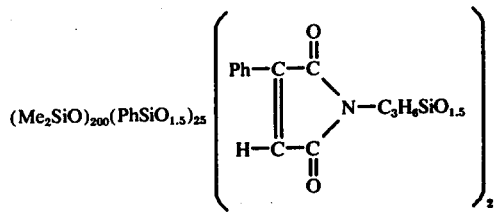

This organopolysiloxane was a solid having a softening point of 90° to 100° C and a viscosity of 18.3 centistokes in a 20% solution in toluene at 25° C.

A zinc sheet was roller-coated with the above organopolysiloxane solution and dried to be free of toluene, to form a dry layer 3 μm thick. The thus coated sheet was overlaid with a transparency of positive patterns in intimate contact, irradiated for 40 seconds with light from a 3-kW xenon lamp 40 cm apart and developed with toluene, to make a dry-planographic printing plate of the present invention.

Printing test was undertaken with the printing plate set to the same printing press as used in Example 1, to produce satisfactorily sharp prints. The stability of the organopolysiloxane on prolonged storage was so excellent as the organopolysiloxane prepared in Example 1.

EXAMPLE 3

Into 104 g of a 15% solution in toluene of the hydrolyzate of phenyltrichlorosilane admixed with 0.23 g of pyridine was dropped 308 g of a 15% solution in toluene of a diorganopolysiloxane terminated at both chain ends with chlorine atoms and expressed by the following formula

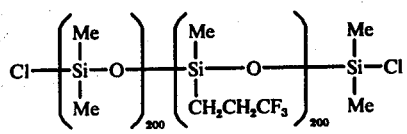

and, after 1 hour of the reaction at 25° C, the reaction mixture was washed with water to be free of the pyridine hydrochloride formed and any remaining pyridine, and dehydrated to give a toluene solution of the copolymerized organopolysiloxane with 15% of the siloxane content. To this solution were added 0.44 g of 3-aminopropyltriethoxysilane and 0.2 g of dibutyltin dilaurate, and the reaction mixture was heated under reflux of toluene for 8 hours to form a solution of an amino group-containing copolymerized organopolysiloxane expressed by the following formula.

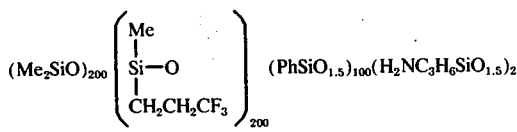

To 412 g of the thus obtained solution of the amino group-containing organopolysiloxane was added 0.42 of α-phenylmaleic anhydride at 25° C. This reaction was carried out stepwise, first at 25° C for 1 hour and then under reflux of toluene for 3 hours to give a 15% solution of an α-phenylmaleimido group-containing organopolysiloxane expressed by the following average formula.

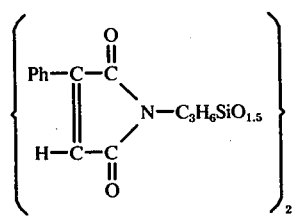

The thus obtained organopolysiloxane had a softening point of 130° to 140° C and a viscosity of 11.6 centistokes in a 15% solution in toluene at 25° C.

An aluminum sheet was coated with the above solution to a coating amount of 5 g/m² as solid, dried to be free of toluene, overlaid with a transparency of positive patterns, irradiated for 60 seconds with light from a 3-kW super-high pressure mercury lamp 40 cm apart and developed with toluene to make a dry-planographic printing plate of the present invention.

Printing test was undertaken with the thus prepared printing plate set to the same printing press as used in Example 1, to produce satisfactorily sharp prints. Another aluminum sheet coated with the solution of the photopolymerizable organopolysiloxane and dried was kept in an air oven at 60° C for more than 800 hours, to result in no decreases of photosensitivity and no fogging by heat, indicative of the excellent stability of the organopolysiloxane.

EXAMPLE 4

Into 104 g of a 15% solution in toluene of the hydrolyzate of phenyltrichlorosilane admixed with 0.23 g of pyridine was dropped 198 g of a 15% solution in toluene of a dimethylpolysiloxane terminated at both chain ends with chlorine atoms and expressed by the formula

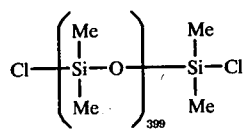

and, after 1 hour of reaction at 25° C, the reaction mixture was washed with water to be free of the pyridine hydrochloride formed and any remaining pyridine and dehydrated to form a 15% solution in toluene of the copolymerized organopolysiloxane. To this solution were added 0.44 g of N-(2-aminoethyl)-3-aminopropyltrimethoxysilane and 10.3 g of dibutyltin dioctoate, and the mixture was heated for 8 hours under reflux of toluene to produce a solution of the amino group-containing copolymerized organopolysiloxane expressed by the following formula.

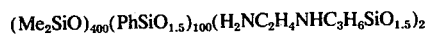

A mixture of 400 g of the above obtained solution and 0.42 g of α-phenylmaleic anhydride was subjected to stepwise reaction, first for 1 hour at 25° C and then for 3 hours under reflux of toluene to give a 15% solution in toluene of an α-phenylmaleimido group-containing organopolysiloxane expressed by the following average formula.

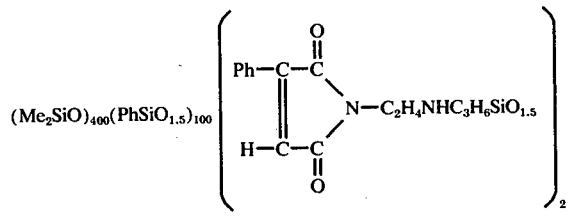

The above organopolysiloxane had a softening point of 135° to 145° C and a viscosity of 12.3 centistokes in a 15% solution in toluene at 25° C.

An aluminum sheet was coated with the above solution of the organopolysiloxane in an amount of 5 g/m² as solid, dried to be free of toluene, overlaid with a transparency of positive patterns in intimate contact, irradiated for 60 seconds with light from a 3-kW super-high pressure mercury lamp 40 cm apart and developed with toluene to make a dry-planographic printing plate.

Printing test was undertaken with the thus prepared printing plate set to the same printing press as used in Example 1, to produce satisfactorily sharp prints.

In the following, Examples 5 to 13 will show the preparation of the photopolymerizable organopolysiloxanes employed in the planographic printing plates of the present invention. Example 14 will describe the making of the printing plates of the present invention, using the photopolymerizable organopolysiloxanes prepared in Examples 5 to 13 and the printing tests therefore to determine their respective printability.

EXAMPLE 5

A mixture composed of 247 g of a 15% solution in toluene of a dimethylpolysiloxane terminated at both chain ends with hydroxy groups and expressed by the formula

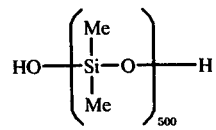

with 13 g of a 15% solution in toluene of the hydrolyzate of phenyltrichlorosilane and 44.5 g of a 15% solution in toluene of and α-phenylmaleimido group-containing organopolysiloxane expressed by the unit formula

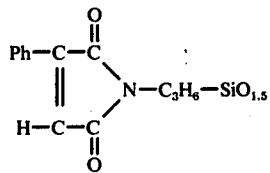

was heated with addition of 0.3 g of zinc octoate under reflux of toluene for 8 hours to produce a 15% solution in toluene of an α-phenylmaleimido group-containing copolymerized organopolysiloxane expressed by the average formula

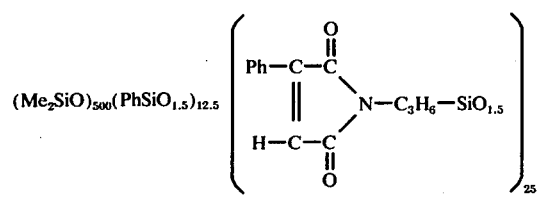

having a viscosity of 89 centistokes at 25° C.

EXAMPLE 6

Into 25.8 g of a 10% solution in toluene of the hydrolyzate of phenyltrichlorosilane admixed with 0.23 g of pyridine was dropped 297 g of a 10% solution in toluene of a dimethylpolysiloxane terminated at both chain ends with chlorine atoms and expressed by the formula

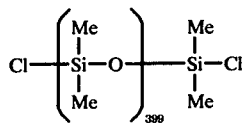

and, after 1 hour of reaction at room temperature, the reaction mixture was washed with water to be free of the pyridine hydrochloride formed and any remaining pyridine and dehydrated to form a 10% solution of the block-copolymerized organopolysiloxane.

Into the above solution of the copolymerized organopolysiloxane were added 0.43 g of a 10% solution in toluene of an α-phenylmaleimido group-containing organopolysiloxane expressed by the formula

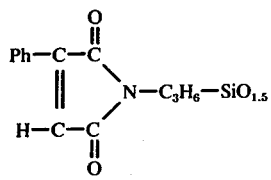

and 0.1 g of dibutyltin dilaurate. The resultant mixture was heated for 10 hours under reflux of toluene to produce a 10% solution in toluene of an α-phenylmaleimido group-containing organopolysiloxane expressed by the formula

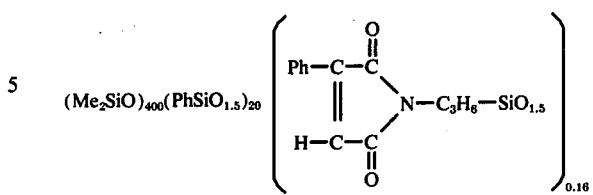

having a viscosity of 14.2 centistokes at 25° C.

EXAMPLE 7

A mixture of 1,235 g of a 15% solution in toluene of a dimethylpolysiloxane terminated at both chain ends with hydroxy groups and expressed by the formula

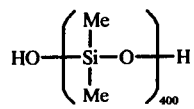

with 26 g of a 15% solution in toluene of the hydrolyzate of phenyltrichlorosilane and 1.8 g of a 15% solution in toluene of an α-phenylmaleimido group-containing organopolysiloxane expressed by the formula

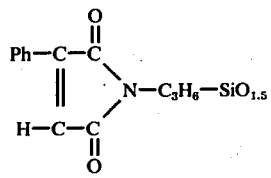

was heated with addition of 0.3 g of dibutyltin dilaurate for 7 hours under reflux of toluene to produce a 15 % solution in toluene of an α-phenylmaleimido group-containing copolymerized organopolysiloxane expressed by the formula

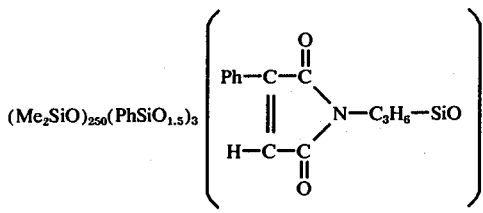

having a viscosity of 13.0 centistokes at 25° C.

EXAMPLE 8

A mixture of 197 g of a 15 % solution in toluene of a dimethylpolysiloxane terminated at both chain ends with hydroxy groups and expressed by the formula

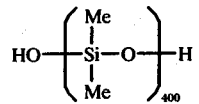

with 172 g of a 15 % solution in toluene of the hydrolyzate of phenyltrichlorosilane and 3.5 g of a 15 % solution in toluene of an α-phenylmaleimido group-containing organopolysiloxane expressed by the formula

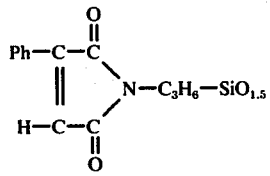

was heated with addition of 0.5 g of dibutyltin dilaurate under reflux of toluene to produce a 15 % solution in toluene of an α-phenylmaleimido group-containing copolymerized organopolysiloxane expressed by the formula

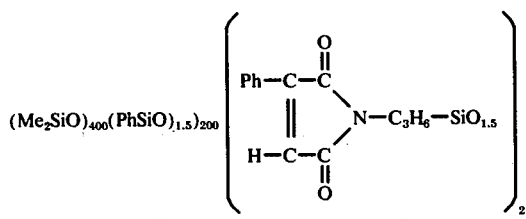

having a viscosity of 6.4 centistokes at 25° C.

EXAMPLE 9

A mixture of 496 g of a 15 % solution in toluene of a dimethylpolysiloxane terminated at both chain ends with hydroxy groups and expressed by the formula

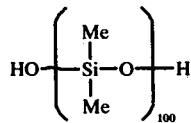

with 130 g of a 15 % solution in toluene of the hydrolyzate of phenyltrichlorosilane and 71.0 g of a 15 % solution in toluene of an α-phenylmaleimido group-containing organopolysiloxane expressed by the formula

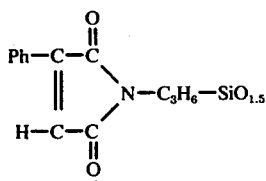

was heated with addition of 0.5 g of dibutyltin dioctoate for 10 hours under reflux of toluene to produce a 15 % solution in toluene of an α-phenylmaleimido group-containing copolymerized organopolysiloxane expressed by the formula

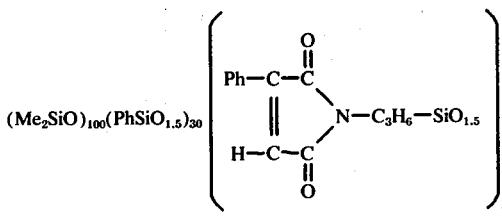

having a viscosity of 8.7 centistokes at 25° C.

EXAMPLE 10

Into 104 g of a 15 % solution in toluene of the hydrolyzate of phenyltrichlorosilane admixed with 0.23 g of pyridine was dropped with agitation 383 g of a 15 % solution in toluene of a diorganopolysiloxane expressed by the formula

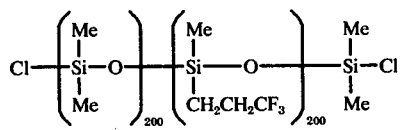

and, after 1 hour of reaction at 25° C, the reaction mixture was washed with water to be free of pyridine hydrochloride formed and any remaining pyridine and dehydrated to produce a 15 % solution in toluene of the copolymerized organopolysiloxane. Then, to this solution were added 0.44 g of 3-aminopropyl triethoxysilane and 0.2 g of dibutyltin dilaurate, followed by heating for 8 hours under reflux of toluene to produce a solution of an aminopropyl group-containing copolymerized organopolysiloxane expressed by the following formula.

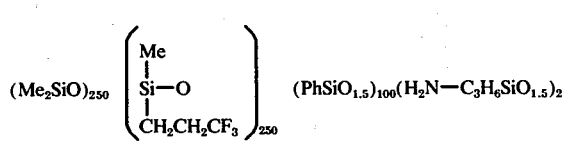

Further, 0.42 g of α-phenylmaleic anhydride was added at 25° C to 487 g of the above obtained solution of the copolymerized organopolysiloxane, followed by reaction stepwise, first at 25° C for 1 hour and then under reflux of toluene for 3 hours, to produce a 15 % solution in toluene of an α-phenylmaleimido group-containing organopolysiloxane expressed by the formula

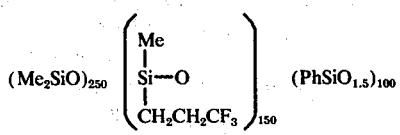

-continued

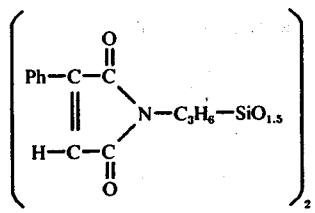

having a viscosity of 11.6 centistokes at 25° C.

EXAMPLE 11

Into 104 g of a 15 % solution in toluene of the hydrolyzate of phenyltrichlorosilane admixed with 0.23 g of pyridine was dropped 494 g of a 15 % solution in toluene of a dimethylpolysiloxane terminated at both chain ends with chlorine atoms and expressed by the formula

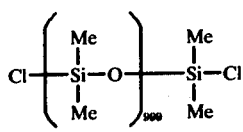

and, after 1 hour of reaction at 25° C, the reaction mixture was washed with water to be free of the pyridine hydrochloride formed and any remaining pyridine and dehydrated to produce a 15 % solution of the copolymerized organopolysiloxane.

To the solution above obtained were added 0.22 g of N-(2-aminoethyl)-3-aminopropyl trimethoxysilane and 0.3 g of dibutyltin dioctoate, followed by 8 hours of reaction to produce a solution of an N-(2-aminoethyl)-3-aminopropyl group-containing copolymerized organopolysiloxane.

Next, 0.21 g of α-phenylmaleic anhydride was added to 598 g of the above-obtained solution of the copolymerized organopolysiloxane and the mixture was subjected to the stepwise reaction first at 25° C for 1 hour and then under reflux of toluene for 3 hours to give a 15 % solution in toluene of an α-phenylmaleimido group-containing organopolysiloxane expressed by the formula

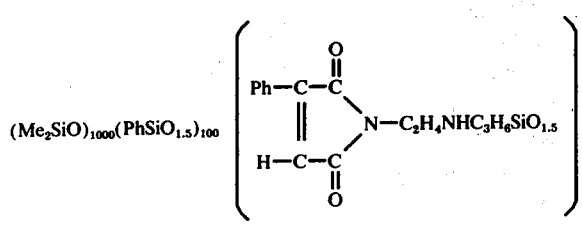

having a viscosity of 12.3 centistokes at 25° C.

EXAMPLE 12.

Into 194 g of a 20 % solution in toluene of the hydrolyzate of phenyltrichlorosilane were dropped 2.36 g of pyridine and 743 g of a 20 % solution in toluene of a dimethylpolysiloxane terminated at both chain ends with chlorine atoms and expressed by the formula

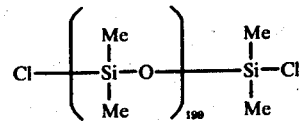

and, after 1 hour of the reaction, the reaction mixture was washed with water to be free of the pyridine hydrochloride formed and any remaining pyridine and dehydrated to produce a 20% solution of the copolymerized organopolysiloxane.

Then, 26.6 g of a 20 % solution in toluene of an α-phenylmaleimido group-containing organopolysiloxane expressed by the formula

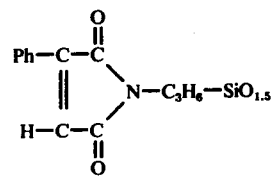

and 0.4 g of dibutyltin dioctoate were added to the above obtained solution of the copolymerized organopolysiloxane to give, after 8 hours of the reaction, a 20 % solution in toluene of an α-phenylmaleimido group-containing organopolysiloxane expressed by the formula.

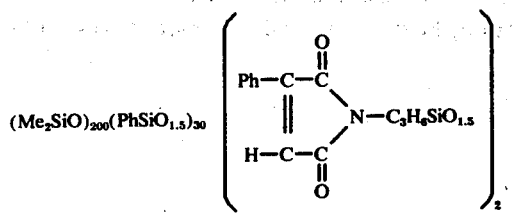

having a viscosity of 18.4 centistokes at 25° C.

EXAMPLE 13

To 214 g of a 15 % solution in toluene of a block-copolymerized organopolysiloxane expressed by the formula

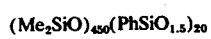

were added 7.1 g of a 15 % solution in toluene of an α-phenylmaleimido group-containing organopolysiloxane expressed by the formula

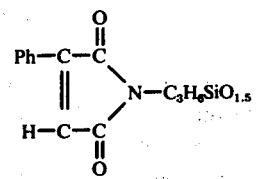

and 0.3 g of dibutyltin dilaurate. The resultant mixture was heated for 4 hours under reflux of toluene to produce a 15 % solution in toluene of an α-phenylmaleimido group-containing organopolysiloxane expressed by the average formula

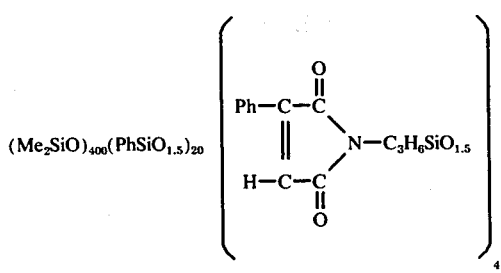

having a viscosity of 35.0 centistokes at 25° C.

Example 14

The photopolymerizable organopolysiloxanes prepared in Examples 5 to 13, having the numbers and molar ratios with respect of the siloxane units expressed by $n$, $n/m$ and $n/l$ as indicated in the table hereunder, were each applied over aluminum sheets 3 mm thick in the form of solutions, to form layers of about 5 μm thick as solid.

Each aluminum sheet thus coated was overlaid with a transparency of positive patterns under reduced pressure, irradiated with light mainly of a 365 nm wave length from a super-high pressure mercury lamp with an intensity of 110 W/m² for an exposure time as indicated in the same table, and developed with trichloroethylene, followed by re-exposure for 5 minutes under the same conditions, to make a dry-planographic printing plate covered with the layer of the photopolymerized and cured organopolysiloxane on the non-image areas.

Printing tests were undertaken for the printing plates set to the same printing press as used in Example 1 to determine the press life of the printing plates. The results are set out in the same table.

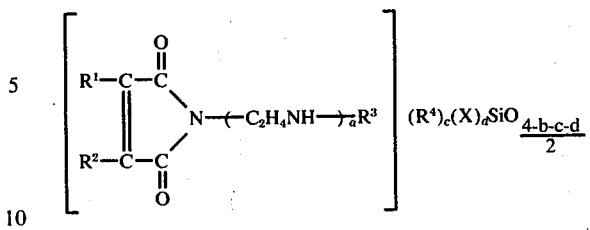

where $R^1$ is a monovalent aromatic group or a monovalent heterocyclic group, $R^2$ is an atom or a group selected from the class consisting of a hydrogen atom, a halogen atom, a cyano group and a monovalent hydrocarbon group with 1 to 4 carbon atoms, $R^3$ is a divalent hydrocarbon group with 1 to 10 carbon atoms, $R^4$ is a monovalent hydrocarbon group, X is a hydroxy group or a hydrolyzable group, a is 0 or 1, and b, c and d each are numbers expressed by $0<b \leq 1$, $0 \leq c \leq 3$ and $0 \leq d \leq 3$, respectively, with the proviso that $0<b+c+d \leq 4$.

2. A planographic printing plate comprising a base having ink-receptive areas and ink-repellent areas thereon, wherein said ink-repellent areas are covered by a cured and hardened layer of a photopolymerizable organopolysiloxane represented by the average unit formula

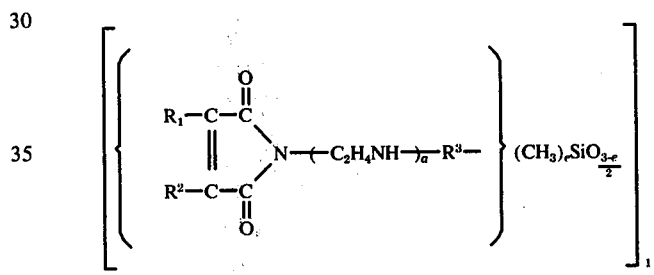

TABLE

| | Example | | | | | | | | |
|---|---|---|---|---|---|---|---|---|---|
| | 5 | 6 | 7 | 8 | 9 | 10 | 11 | 12 | 13 |
| Kind of organopolysiloxane prepared | | | | | | | | | |
| n | 500 | 400 | 250 | 400 | 100 | 400 | 1000 | 200 | 400 |
| n/m | 40 | 20 | 83.3 | 2 | 3.3 | 4 | 10 | 6.7 | 20 |
| n/l | 20 | 2500 | 250 | 200 | 25 | 200 | 1000 | 100 | 100 |
| Condition of the organopolysiloxane layer before exposure | B* | A** | B* | A** | B* | A** | A** | B* | A** |
| Exposure time, sec. | 30 | 300 | 90 | 60 | 30 | 40 | 40 | 50 | 30 |
| Ink-repellency | Fair | Good | Good | Fair | Fair | Good | Good | Good | Good |
| Press life, number of copies printed | 1000 | 500 | 5000 | 1000 | 15000 | 40000 | 40000 | 30000 | 40000 |

B* denotes some scratches on the layer surface.
A** denotes a good condition of the layer.

What is claimed is:

1. A planographic printing plate comprising a base having ink-receptive areas and ink-repellent areas thereon, wherein said ink-repellent areas are covered by a cured and hardened layer of a photopolymerizable organosilicon compound represented by the average unit formula

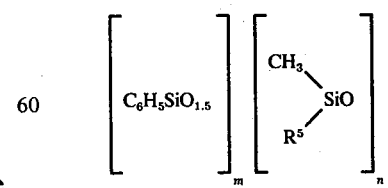

wherein $R^1$ is a monovalent aromatic group or a monovalent heterocyclic group, $R^2$ is an atom or a group selected from the class consisting of a hydrogen atom, a halogen atom, a cyano group and a monovalent hydrocarbon group with 1 to 4 carbon atoms, $R^3$ is a divalent hydrocarbon group with 1 to 10 carbon atoms, $R^5$ is a methyl group or a 3,3,3-trifluoropropyl group, $a$ is 0 or 1, $e$ is 0 or 1, $n$ is a positive number not less than 25, and 1 and m each are positive numbers with the proviso that $n/l$ is from 25 to 2,000 and $n/m$ is from 2.5 to 50.

3. The planographic printing plate as claimed in claim 2 wherein $l$, $m$ and $n$ are positive numbers such that $n/l$ is from 50 to 1,000 and $n/m$ is from 5 to 25.

4. The planographic printing plate as claimed in claim 1 wherein said base is a metal or plastic sheet.

5. The planographic printing plate as claimed in claim 2 wherein said base is a metal or plastic sheet.

6. The planographic printing plate as claimed in claim 1 wherein said monovalent aromatic group denoted by $R^1$ is a phenyl group.

7. The planographic printing plate as claimed in claim 2 wherein said monovalent aromatic group denoted by $R^1$ is a phenyl group.

8. The planographic printing plate as claimed in claim 1 wherein said monovalent heterocyclic group denoted by $R^1$ is selected from the class consisting of thienyl, furyl and pyridyl groups.

9. The planographic printing plate as claimed in claim 2 wherein said monovalent heterocyclic group denoted by $R^1$ is selected from the class consisting of thienyl, furyl and pyridyl groups.

10. A method for the preparation of the planographic printing plate as claimed in claim 1 comprising the successive steps of
   a. providing on said base a cured and hardened layer of said photopolymerizable organopolysiloxane,
   b. overlaying said layer with a transparency of positive patterns in intimate contact,
   c. irradiating said layer with light imagewise through said transparency, and
   d. developing the image by washing away the layer of said photopolymerizable organopolysiloxane on unexposed areas, leaving the photopolymerized and cured layer of said photopolymerizable organopolysiloxane on exposed areas.

11. A method for the preparation of the planographic printing plate as claimed in claim 2 comprising the successive steps of
   a. providing on said base a cured and hardened layer of said photopolymerizable organopolysiloxane,
   b. overlaying said layer with a transparency of positive patterns in intimate contact,
   c. irradiating said layer with light imagewise through said transparency, and
   d. developing the image by washing away the layer of said photopolymerizable organopolysiloxane on unexposed areas, leaving the photopolymerized and cured layer of said photopolymerizable organopolysiloxane on exposed areas.

12. The method for the preparation of the planographic printing plate as claimed in claim 10 wherein a fixing step is additionally added after the successive steps of (a) to (d).

13. The method for the preparation of the planographic printing plate as claimed in claim 11 wherein a fixing step is additionally added after the successive steps of (a) to (d).

14. The method for the preparation of the planographic printing plate as claimed in claim 12 wherein said fixing step is performed by subjecting the exposed areas to re-exposure.

15. The method for the preparation of the planographic printing plate as claimed in claim 13 wherein said fixing step is performed by subjecting the exposed areas to re-exposure.

16. The method for the preparation of the planographic printing plate as claimed in claim 10 wherein said photopolymerizable organopolysiloxane is applied on said base in the form of solution in an organic solvent.

17. The method for the preparation of the planographic printing plate as claimed in claim 11 wherein said photopolymerizable organopolysiloxane is applied on said base in the form of solution in an organic solvent.

18. The method for the preparation of the planographic printing plate as claimed in claim 10 wherein said base is coated with a primer before said successive steps are carried out.

19. The method for the preparation of the planographic printing plate as claimed in claim 11 wherein said base is coated with a primer before said successive steps are carried out.

20. The method for the preparation of the planographic printing plate as claimed in claim 10 wherein said photopolymerizable organopolysiloxane is applied on said base in the form of mixture with a filler.

21. The method for the preparation of the planographic printing plate as claimed in claim 11 wherein said photopolymerizable organopolysiloxane is applied on said base in the form of mixture with a filler.

22. The method for the preparation of the planographic printing plate as claimed in claim 10 wherein said photopolymerizable organopolysiloxane is applied on said base in the form of mixture with an inhibitor for thermal polymerization.

23. The method for the preparation of the planographic printing plate as claimed in claim 11 wherein said photopolymerizable organopolysiloxane is applied on said base in the form of mixture with an inhibitor for thermal polymerization.

* * * * *

UNITED STATES PATENT OFFICE
CERTIFICATE OF CORRECTION

Patent No. 4,019,904             Dated April 26, 1977

Inventor(s) Atsumi Noshiro et al

It is certified that error appears in the above-identified patent and that said Letters Patent are hereby corrected as shown below:

In the heading of the patent [30] should read as follows:

--[30] Foreign Application Priority Data

April 14, 1975    Japan........50-44969--.

Signed and Sealed this

Twenty-second Day of November 1977

[SEAL]

Attest:

RUTH C. MASON  
Attesting Officer

LUTRELLE F. PARKER  
Acting Commissioner of Patents and Trademarks